(12) United States Patent
Zhu et al.

(10) Patent No.: US 11,958,786 B1
(45) Date of Patent: Apr. 16, 2024

(54) CALCIUM-MAGNESIUM ALUMINOSILICATE (CMAS) RESISTANT THERMAL AND ENVIRONMENTAL BARRIER COATINGS

(71) Applicant: United States of America, as represented by the Administrator of NASA, Washington, DC (US)

(72) Inventors: Dongming Zhu, Westlake, OH (US); Gustavo Costa, Cleveland, OH (US)

(73) Assignee: UNITED STATES GOVERNMENT ADMINISTRATOR OF NASA, Washington, DC (US)

( * ) Notice: Subject to any disclaimer, the term of this patent is extended or adjusted under 35 U.S.C. 154(b) by 357 days.

(21) Appl. No.: 15/824,036

(22) Filed: Nov. 28, 2017

Related U.S. Application Data

(60) Provisional application No. 62/429,934, filed on Dec. 5, 2016.

(51) Int. Cl.
| | |
|---|---|
| *C04B 41/50* | (2006.01) |
| *C04B 41/00* | (2006.01) |
| *C04B 41/45* | (2006.01) |
| *C04B 41/51* | (2006.01) |
| *C04B 41/52* | (2006.01) |
| *C04B 41/87* | (2006.01) |
| *C09D 1/00* | (2006.01) |
| *C09D 5/08* | (2006.01) |

(52) U.S. Cl.
CPC ........ *C04B 41/009* (2013.01); *C04B 41/5024* (2013.01); *C04B 41/5035* (2013.01); *C04B 41/5042* (2013.01); *C04B 41/5044* (2013.01); *C04B 41/5045* (2013.01); *C04B 41/5096* (2013.01); *C04B 41/5122* (2013.01); *C04B 41/5144* (2013.01); *C04B 41/52* (2013.01); *C04B 41/87* (2013.01); *C09D 1/00* (2013.01); *C09D 5/084* (2013.01)

(58) Field of Classification Search
CPC .................. C04B 41/5042; C04B 41/5045
See application file for complete search history.

(56) References Cited

U.S. PATENT DOCUMENTS

| | | |
|---|---|---|
| 6,777,093 B1 | 8/2004 | Ojard et al. |
| 7,060,360 B2 | 6/2006 | Eaton et al. |
| 7,300,702 B2 | 11/2007 | Li et al. |
| 7,354,651 B2 | 4/2008 | Hazel et al. |
| 7,442,444 B2 | 10/2008 | Hazel et al. |

(Continued)

OTHER PUBLICATIONS

Dongming Zhu, "Environmental Barrier Coatings for Turbine Engines: Current Status and Future Directions," International Conference on Metallurgical Coatings and Thin Films (ICMCTF), May 1, 2013.

(Continued)

*Primary Examiner* — Adam Krupicka
(74) *Attorney, Agent, or Firm* — Robert H. Earp, III; Mark Wolfgang; Trenton J. Roche

(57) ABSTRACT

A barrier coating system may include a super alloy or ceramic matrix composite (CMC) substrate underneath a bond coat. The barrier coating system may also include a calcium-magnesium aluminosilicate (CMAS) resistant coating configured to protect metallic, or oxide-based or silicon based components in a harsh CMAS environment.

21 Claims, 4 Drawing Sheets

100

(56) References Cited

U.S. PATENT DOCUMENTS

| | | | |
|---|---|---|---|
| 7,740,960 B1* | 6/2010 | Zhu | C04B 35/185 |
| | | | 428/699 |
| 7,763,356 B2 | 7/2010 | Berczik et al. | |
| 2005/0026770 A1* | 2/2005 | Zhu | C04B 35/486 |
| | | | 501/103 |
| 2006/0046090 A1* | 3/2006 | Spitsberg | C23C 4/11 |
| | | | 428/689 |
| 2006/0280962 A1 | 12/2006 | Hazel et al. | |
| 2009/0061530 A1* | 3/2009 | Bossmann | G01K 3/04 |
| | | | 436/164 |
| 2009/0169873 A1 | 7/2009 | Louchet-Pouillerie et al. | |
| 2010/0080984 A1 | 4/2010 | Lee | |
| 2010/0104859 A1 | 4/2010 | Berczik et al. | |
| 2010/0119718 A1 | 5/2010 | Tulyani et al. | |
| 2010/0129673 A1 | 5/2010 | Lee | |
| 2010/0159253 A1 | 6/2010 | Kirby et al. | |
| 2011/0027559 A1 | 2/2011 | Kirby et al. | |
| 2011/0151239 A1 | 6/2011 | Lane et al. | |
| 2012/0328886 A1 | 12/2012 | Schmidt et al. | |
| 2013/0344319 A1* | 12/2013 | Zhu | C04B 41/5044 |
| | | | 428/335 |

OTHER PUBLICATIONS

Dongming Zhu, "Advanced Environmental Barrier Coating Development and Testing for SiC/SiC Ceramic Matrix Composites," Workshop on the Design of Ceramic-Fiber Based Composites for Service Above 1400 C, Jun. 2012.

* cited by examiner

100

300

CALCIUM-MAGNESIUM ALUMINOSILICATE (CMAS) RESISTANT THERMAL AND ENVIRONMENTAL BARRIER COATINGS

CROSS-REFERENCE TO RELATED APPLICATION

This application claims the benefit of U.S. Provisional Patent Application No. 62/429,934, filed on Dec. 5, 2016. The subject matter thereof is hereby incorporated herein by reference in its entirety.

ORIGIN OF THE INVENTION

The invention described herein was made by an employee of the United States Government and may be manufactured and used by or for the Government for Government purposes without the payment of any royalties thereon or therefore.

FIELD

The present invention relates to a barrier coating and, more particularly, to a thermal and environmental barrier coating system resistant to harsh CMAS environments.

BACKGROUND

Thermal and Environmental barrier coating (TEBC) systems are multi-layer ceramic layers, generally applied by air or low-pressure plasma spraying and/or physical vapor deposition methods. Some of these methods include Electron Beam-Physical Vapor Deposition (EB-PVD), or Plasma-Spray Physical Vapor Deposition (PS-PVD), and High Temperature Vacuum Vapor Deposition, Chemical Vapor Deposition, Polymer Derived Coatings and Slurry coatings. These methods are used to protect metallic nickel base super alloy and ceramic monolithic or ceramic matrix composite (CMC) turbine engine components in environments or conditions such as high temperature gas flow impingements, water vapor and/or other combustion gas attacks in gas turbine or other heat engines, and resistant to thermal cycling and mechanical fatigue operating conditions.

The ever-increasing higher engine operating temperatures and pressures for next generation jet engine turbine hot-section components (e.g., 2700° F. or ~1500° C.) introduce significant issues of environmental durability. Many common silica sand-containing materials, such as road sand, ash, and dust, melt at approximately 1100-1200° C. These materials deposit on the ceramic thermal and environmental barrier coatings, forming glassy melts of CMAS. This molten CMAS and Na-containing molten salt interacts chemically and mechanically with coatings to cause premature and accelerated coating failure. To further increase the engine operating temperatures and performance, including incorporating emerging, more advanced light-weight ceramic components, designing the CMAS resistant TEBC coating systems in CMAS environments with long-term durability becomes crucial.

Current thermal and environmental barrier systems include $ZrO_2$-7-8) wt % $Y_2O_3$, barium and strontium aluminosilicate (BSAS), mullite, and rare Earth (RE) silicates such as ytterbium silicates ($Yb_2Si_2O_7$ and $Yb_2SiO_5$). However, these barrier systems do not have sufficient CMAS resistance. For example, thermal barrier coatings, such as $ZrO_2$-(7-8) wt % $Y_2O_3$, corrode with leaching out $Y_2O_3$ in CMAS environment. The molten CMAS infiltration may result in coating delamination and spallation. The barrier system may also degrade and melt in the high temperature engine environments. Thus, an alternative barrier coating system may be more beneficial.

SUMMARY

Certain embodiments of the present invention may provide solutions to the problems and needs in the art that have not yet been fully identified, appreciated, or solved by current barrier coating systems. For example, some embodiments generally pertain to a barrier coating system.

In one embodiment, the barrier coating system includes a super alloy or ceramic matrix composite (CMC) substrate underneath a bond coat and a calcium-magnesium aluminosilicate (CMAS) resistant coating configured to protect metallic, or oxide-based or silicon based components in a harsh CMAS environment.

In another embodiment, an apparatus includes a substrate layer composed of a ceramic oxide, silicon (Si) based substrate, or a silicon carbide/silicon carbide (SiC/SiC) CMC substrate. The apparatus also includes a bond coat comprising Si, $HfO_2$—Si based coating systems, Rare Earth (RE)-Si based bond coat, or a combination thereof. The apparatus further includes a barrier layer comprising a RE doped mullite, RE silicate doped mullite, RE silicate doped rare aluminum garnets, and a RE aluminosilicate oxygen barrier layer.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments generally pertain to a barrier coating system such as a CMAS resistant, multicomponent defect clustering composition coating system. The barrier coating system may use thermal and environmental barrier coatings to protect metallic and oxide-based and Si-based ceramic components in the harsh CMAS containing engine combustion and water vapor environments. The barrier coating system may be resilient against high velocity and harsh and large quantity CMAS conditions. For example, these conditions may be where Rare Earth oxides dissolve into the CMAS melts, resulting in the coating surfaces and coating grains recess, and eventually the loss of the barrier coating systems.

Figure 1:
FIG. 1 is a block diagram illustrating a barrier coating system, according to an embodiment of the present invention.
Figure 1:
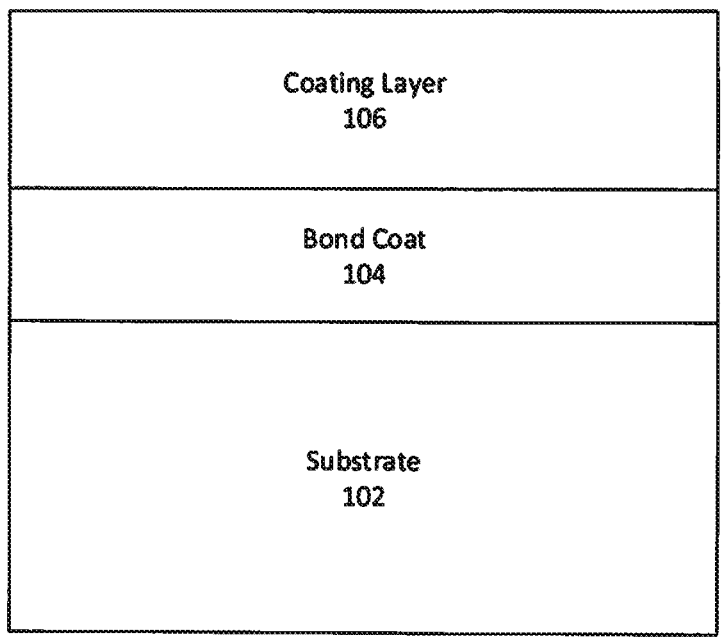

The barrier coating system may address the coating corrosion and recession due to CMAS melts. FIG. 1 is a block diagram illustrating a barrier coating system 100, according to an embodiment of the present invention. In some embodiments, barrier coating system 100 may include a substrate 102, a bond coat 104, and a coating layer 106. For example, substrate 102 may be composed of a nickel base super alloy substrate. Bond coat 104 may comprise of at least one or more of the following: Platinum aluminide PtAl, Nickel Platinum Aluminide Ni(PtAl), and Nickel, Cobalt-Chromium-Aluminum-Yttrium MCrAlY (M stands for Ni, Co). Coating layer 106 may be comprised of at least a CMAS resistant zirconia ($ZrO_2$) and Hafnia ($HfO_2$) coating layer.

Figure 2:
FIG. 2 is a block diagram illustrating a barrier coating system, according to an embodiment of the present invention.
Figure 2:
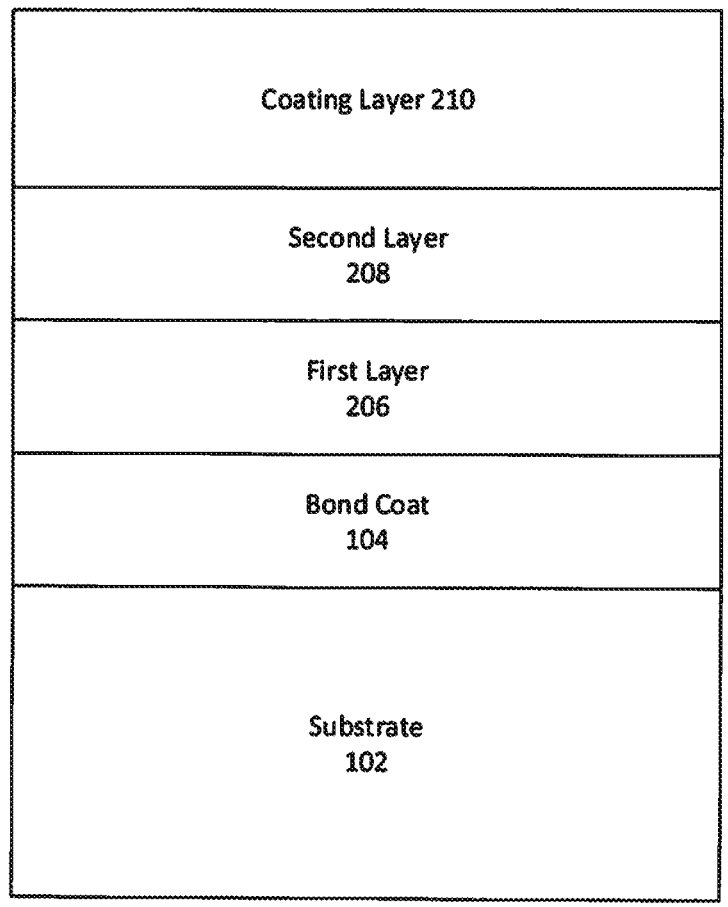

FIG. 2 is a block diagram illustrating a barrier coating layer 200, according to an embodiment of the present invention. In some embodiments, barrier coating layer 200 may include a substrate 202, a bond coat 204, a first (or barrier) layer 206, a second (or an intermediate layer) layer 208 that is between first layer 206 and a coating layer 210. Substrate 202 may be composed of a ceramic oxide, S-based substrate, or a SiC/SiC CMC substrate. Bond coat 204 may comprise silicon (Si), $HfO_2$—Si based coating systems, Rare Earth (RE)-Si based bond coat, or a combination thereof. Barrier layer 206 may be comprised of a RE doped mullite, RE aluminum garnets, and a RE aluminosilicate oxygen barrier layer. Second layer 208 may be comprised of a multicomponent RE silicates $RE_2Si_2\text{-}xO_{7\text{-}2X}$ EBC, where x is in a range of 0-1.95 for an environmental barrier coating that has superior oxidation resistance. The CMAS resistant silicate compositions are provided when X>1.

In another embodiment, hafnium can be doped into $RE_2Si_2\text{-}xO_{7\text{-}2X}$ for superior temperature capability and CMAS resistance.

It should be appreciated that coating layer 210 may be comprised of a CMAS resistant top coating system. This top coating system may include a base oxide selected from a group comprising of zirconia ($ZrO_2$), hafnia ($HfO_2$), a RE oxide ($RE_2O_3$) and combinations thereof.

For required high temperature stability and low thermal conductivity, and for high performance turbine component thermal and environmental barrier coating, a primary stabilizer dopant comprising a second component may be selected from the group of metal and/or RE oxides comprising of yttria ($Y_2O_3$), dysporia ($Dy_2O_3$), euria (Eu2O3), $CaO_2$ or any combination thereof.

In certain embodiments, barrier coating system may include a special composition range for the defect cluster compositions third and fourth oxide components, which are comprised of cluster dopant oxides. These cluster dopant oxides promote the formation of extended defects and defect clusters, which aid in the reduction of the oxide diffusion, creep rates and intrinsic thermal conductivity, and help improve the CMAS resistance.

In yet some further embodiments, a third component cluster dopant oxide is selected from a group of RE oxides, which has a larger ionic size than the primary stabilizer component and/or the base oxide component. This group of large RE oxides is comprised of an oxide of neodymium, samarium, europium, gadolinium, or any combination thereof, and facilitate the RE zirconate pyrochlore oxide phase formations at segregated nano-sized cluster regions.

A fourth component cluster dopant oxide may be selected from a group of RE oxides, which has a smaller ionic size than the primary stabilizer component and/or the base oxide component, thus possessing high stability. This cluster dopant to further facilitate nano-cluster formation particularly within coating grain and grain boundaries, reduces the coating grain CMAS penetration, improving the CMAS resistance. This group of small RE oxides is selected from the oxides of ytterbium, holmium, lutetium and combinations thereof.

In some embodiments, the cluster coating system may be written as follows: $ZrO_2(HfO_2)$—$Y_2O_3$ ($Dy_2O_3$)($Eu_2O_3$)—$RE_2O_3$ (larger ionic size)-$RE_2O_3$ (smaller ionic size)

To increase the CMAS resistance, an additional CMAS resistant dopant, such as CaO, may also be incorporated. The incorporation of CaO may improve the CMAS resistance, and may be written as follows: $ZrO_2$ ($HfO_2$)—$Y_2O_3$ ($Dy_2O_3$)($Eu_2O_3$)—$RE_2O_3$ (larger ionic size)-$RE_2O_3$ (smaller ionic size)-CaO The coating may also be co-doped with alumina ($Al_2O_3$), tantalum oxide ($Ta_2O_5$), and titanium oxide ($TiO_2$) to form high melting compounds and reducing RE leaching out, and toughening the coating systems. The plasma sprayed coating powder composite particles cladding (for plasma spray processing) or co-deposition (for vapor deposition) of these elements may improve the resistance of the RE oxide leaching into the CMAS melts.

In some embodiments, CMAS resistant cluster coating compositions may be designed to include the majority phase of the tetragonal or non-transformable t' phase or cubic fluoride phase of $ZrO_2$, or $HfO_2$ within the coatings near the t' and in the cubic fluoride phase boundaries but in contact with the pyrochlore phase region. This way, the pyrochlore phase fractions and distributions are effectively controlled. The t' phase or cubic phase may have a higher toughness as compared to the pyrochlore phase. The lower RE dopant designs also help reduce the coating dissolution and recession in contacting with the CMAS melts. A coating composition range of 8-15 mole % RE dopant concentrations, i.e., $ZrO_2$-(8-15 mol %) $RE_2O_3$, is shown for $ZrO_2$ and $HfO_2$ based systems.

Figure 3:
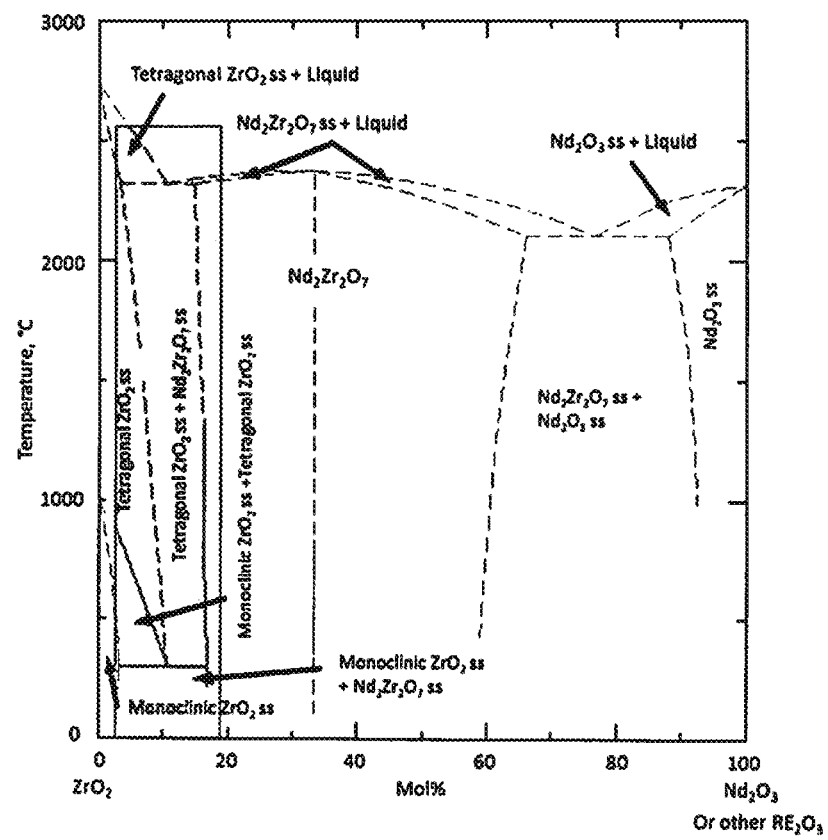
FIG. 3 is a graph illustrating an optimum CMAS resistant composition range, according to an embodiment of the present invention.

See, for example, FIG. 3, which is a graph 300 illustrating an optimum CMAS resistant composition range, according to an embodiment of the present invention. $HfO_2$ based systems tend to be more resistant to CMAS, and with higher temperature capability, the preferred RE dopant concentration may be in the range of 5-20 mol %. In certain embodiments, the coating compositions may have RE dopant composition range of 1 to 20 mol %. The composition of CaO dopant is from 1 to 10 mol %. The other dopants, namely, $Al_2O_3$, $Ta_2O_5$, and $TiO_2$, can be incorporated in a range of 1-5 mol %.

In some additional embodiments, to achieve the CMAS resistance designs, the composition may have a range of 8 to 15 mol % for the $ZrO_2$ based coatings, i.e., $ZrO_2$-(8-15 mol %) $RE_2O_3$, and have the range of 5 to 20 mol % for the $HfO_2$ based coatings, i.e., $ZrO_2$-(5-20 mol %) $RE_2O_3$. For the $ZrO_2$ and $HfO_2$ CMAS resistant coatings, the composition range of the primary stabilizer dopant, such as $Y_2O_3$, ranges from 1 to 15 mol %. For example, the composition range of the primary stabilizer dopant is between 6 and 10 mol %, and in some cases, the composition range is between 8 and 10 mol %.

The composition of the Group A and Group B RE oxide dopants each range from 03 to 4 mol %, and may range from 1 to 3 mol %. In some embodiments, Group A and Group B RE oxides may be present in equal molar amounts. The composition of CMAS resistant dopant, CaO, may range from 1 to 5 mol %, for example.

Figure 4:
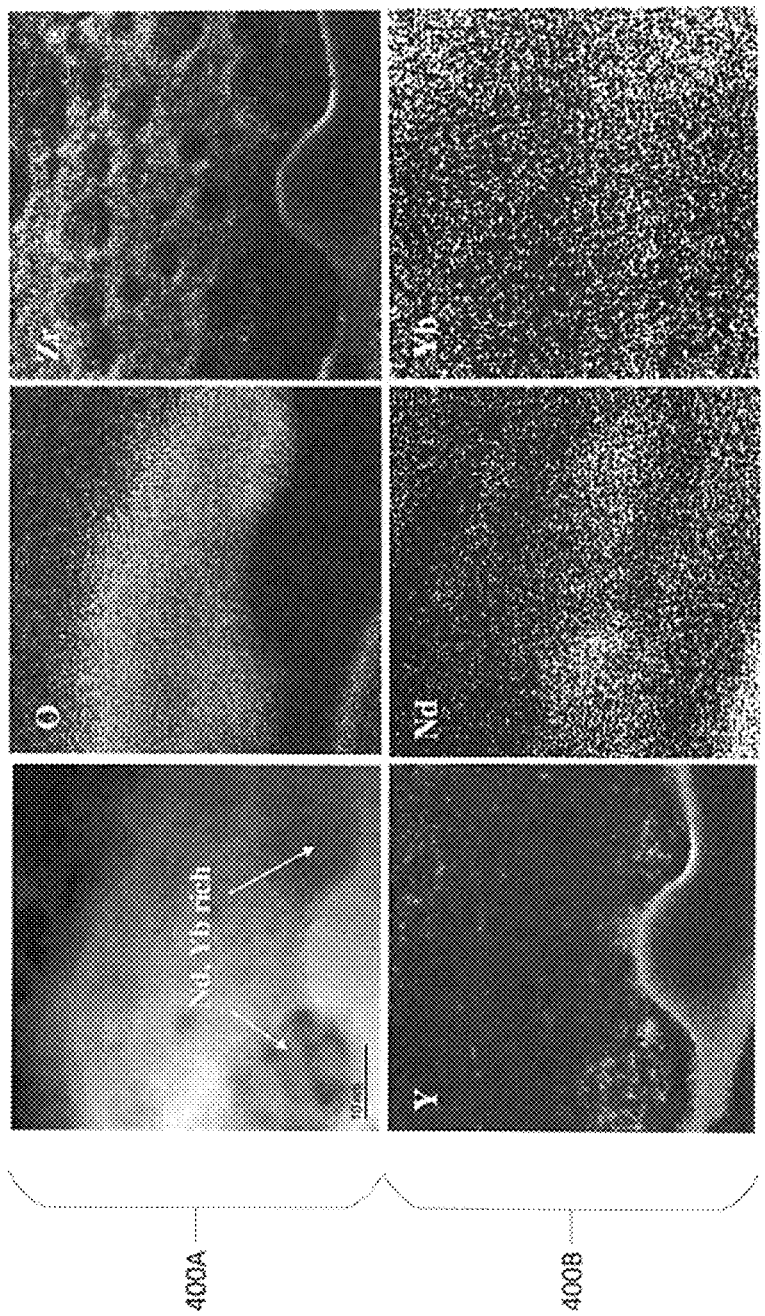
FIG. 4 illustrates high resolution transmission electron microscope lattice moire images and Electron Energy Loss Spectroscopy (EELS) composition maps of nano-sized clusters of an EB-PVD Nd- and Yb-Doped $ZrO_2$—$Y_2O_3$ Coating, according to an embodiment of the present invention.

FIG. 4 illustrates high resolution transmission electron microscope lattice moire images and Electron Energy Loss Spectroscopy (EELS) composition maps of nano-sized clusters of an EB-PVD Nd- and Yb-Doped $ZrO_2$—$Y_2O_3$ Coating, according to an embodiment of the present invention. Images 400A and 400B show optimum concentration RE element segregations that help reduce RE dopant diffusion and leaching into the CMAS melts, improving the coating stability and CMAS resistance.

Some embodiments generally pertain to an advanced high temperature capable, multi-component, defect-clustering composition thermal and environmental barrier coating system for protecting Si-based ceramics, SiC/SiC CMC. In some further embodiments, the coating system protects nick-based super alloy and/or oxide or oxide ceramic matrix composite turbine engine components. The coating system may achieve exceptional CMAS resistance and durability for both metallic and ceramic turbine engine hot-section components in environments such as harsh high temperature, high velocity combustion gas, particulate impact loading, low melting CMAS and/or volcanic ash, and marine molten salt environments. The coating systems also improve the engine component durability and prime-reliant ceramic coated engine components.

In some embodiments, the advanced CMAS resistant thermal and environmental barrier coating system with the compositions developed for nickel-based super alloy, and for ceramic and CMC component applications, have demonstrated higher temperature capabilities and durability than convention barrier coating systems. This barrier coating system is extremely critical for advanced, future high performance gas turbine engine applications. It should be appreciated that two coatings ($ZrO_2$-2.5 mol % $Y_2O_3$-1.0 mol % $Gd_2O_3$-1.0 mol % $Yb_2O_3$ and $HfO_2$-2 mol % $Y_2O_3$-2 mol % $Gd_2O_3$-16 mol % $Yb_2O_3$) were selected after passing the high temperature Beacon CMAS burner rig qualification tests. The two composition coated coatings on turbine engine doublet vanes were also successfully tested and demonstrated in an engine CMAS ingestion tests showing the CMAS resistance.

In certain embodiments, a new dopant CaO addition may be incorporated for this barrier coating system, and further down-selected CMAS resistant composition ranges. The thermal and environmental barrier bond coating system is one of the most critical technologies that would lead to the future realization of advanced metallic and SiC/SiC CMC turbine engine combustor liners and vanes, and turbine blades. As a result, the engines may be operated at much higher temperatures with significantly reduced cooling. This barrier coating system may also be used in land-based stationary gas turbines for power generation, and other energy related heat engine systems.

In certain embodiments, multi-component rare earth oxides, RE aluminum garnets, and oxide-rich silicates (such as $RE_2Si_2$-$xO_{7-2x}$), can be controlled to specifically enrich or decorate the grain boundaries of layer 106; layers 206, 208, and 210.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
a substrate, wherein the substrate is made of a material selected from the group consisting of a nickel-based superalloy, a ceramic oxide, a silicon-based material, and a silicon carbide composite;
a bond coat layer disposed on the substrate; and
a coating layer disposed on the bond coat layer, wherein the coating layer comprises:
a base oxide of hafnia, zirconia, or a combination thereof; and
a plurality of rare earth dopants, wherein the rare earth dopants comprise from 5 to 20 mol % of the coating layer, wherein the plurality of rare earth dopants comprise:
a primary stabilizer dopant;
a first cluster dopant oxide having a larger ionic size than the primary stabilizer dopant;

a second cluster dopant oxide having a smaller ionic size than the primary stabilizer dopant; and a calcium oxide dopant, wherein the calcium oxide dopant comprises from 1 mol % to 10 mol % of the coating layer.

2. The apparatus of claim 1, wherein the base oxide comprises hafnia.

3. The apparatus of claim 1, wherein the base oxide comprises zirconia.

4. The apparatus of claim 3, wherein the rare earth dopants comprise from 8 to 15 mol % of the coating layer.

5. The apparatus of claim 1, wherein the coating layer further comprise from 1 to 5 mol % of at least one additional dopant selected from the group consisting of $Al_2O_3$, $Ta_2O_5$, and $TiO_2$.

6. The apparatus of claim 1, wherein primary stabilizer dopant constitutes from 1 to 15 mol % of the coating layer.

7. The apparatus of claim 6, wherein primary stabilizer dopant constitutes from 6 to 10 mol % of the coating layer.

8. The apparatus of claim 7, wherein primary stabilizer dopant constitutes from 8 to 10 mol % of the coating layer.

9. The apparatus of claim 6, wherein the primary stabilizer dopant comprises yttria, dysprosia, euria, or combinations thereof.

10. The apparatus of claim 9, wherein the first cluster dopant oxide comprises neodymium, samarium, europium, gadolinium, or combinations thereof.

11. The apparatus of claim 10, wherein the second cluster dopant oxide comprises ytterbium, holmium, lutetium, or combinations thereof.

12. The apparatus of claim 11, wherein the first and second cluster dopant oxides each constitute from 0.5 to 4 mol % of the coating layer.

13. The apparatus of claim 12, wherein the calcium oxide dopant constitutes from 1 to 5 mol % of the coating layer.

14. The apparatus of claim 12, wherein the first and second cluster dopant oxides are present in equal molar amounts within the coating layer.

15. The apparatus of claim 1, wherein the base oxide is present in the coating layer in a non-transformable t' phase or cubic fluoride phase.

16. The apparatus of claim 1, wherein the bond coat layer comprises silicon (Si), a $HfO_2$—Si based coating system, a Rare Earth (RE)-Si-based bond coat, or a combination thereof.

17. The apparatus of claim 1, further comprising a first barrier layer disposed directly on the bond coat layer, wherein the first barrier layer comprises one or more of a rare earth doped mullite, a rare earth aluminum garnet, and a rare earth aluminosilicate oxygen barrier layer.

18. The apparatus of claim 17, further comprising a second barrier layer disposed directly on the first barrier layer between the first barrier layer and the coating layer, wherein the second barrier layer comprises a multi-component rare earth silicate.

19. The apparatus of claim 18, wherein the multi-component rare earth silicate has a rare earth ("RE") composition of $RE_2Si_{2-X}O_{7-2X}$, with X being between 0 and 1.95.

20. The apparatus of claim 19, wherein X is between 1 and 1.95.

21. An apparatus, comprising:
a substrate, wherein the substrate is made of a material selected from the group consisting of a nickel-based superalloy, a ceramic oxide, a silicon-based material, and a silicon carbide composite;
a bond coat layer comprising silicon (Si), a $HfO_2$—Si based coating system, a Rare Earth (RE)-Si-based bond coat, or a combination thereof disposed on the substrate;
a coating layer disposed on the bond coat layer, wherein the coating layer comprises:
a base oxide of hafnia, zirconia, or a combination thereof; and
a plurality of rare earth dopants, wherein the rare earth dopants comprise from 5 to 20 mol % of the coating layer, wherein the plurality of rare earth dopants comprise:
a primary stabilizer dopant comprising yttria, dysprosia, euria, or combinations thereof;
a first cluster dopant oxide, which has a larger ionic size than the primary stabilizer dopant, comprising neodymium, samarium, europium, gadolinium, or combinations thereof;
a second cluster dopant oxide, which has a smaller ionic size than the primary stabilizer dopant, comprising ytterbium, holmium, lutetium, or combinations thereof; and
a calcium oxide dopant, which comprises from 1 mol % to 10 mol % of the coating layer;
a first barrier layer disposed directly on the bond coat layer, wherein the first barrier layer comprises one or more of a rare earth doped mullite, a rare earth aluminum garnet, and a rare earth aluminosilicate oxygen barrier layer;
a second barrier layer disposed directly on the first barrier layer between the first barrier layer and the coating layer, wherein the second barrier layer comprises a multi-component rare earth silicate,
wherein the multi-component rare earth silicate has a rare earth ("RE") composition of $RE_2Si_{2-X}O_{7-2X}$, with X being between 0 and 1.95.

* * * * *